(12) United States Patent
Yoshikoshi

(10) Patent No.: US 6,351,431 B2
(45) Date of Patent: Feb. 26, 2002

(54) SEMICONDUCTOR MEMORY DEVICE

(75) Inventor: Takeshi Yoshikoshi, Kawasaki (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/866,893

(22) Filed: May 29, 2001

(30) Foreign Application Priority Data

May 29, 2000 (JP) ........................................ 2000-158883

(51) Int. Cl.[7] ................................................ G11C 8/00
(52) U.S. Cl. .................................. 365/230.06; 365/194
(58) Field of Search ...................... 365/230.06, 189.11, 365/156, 154, 194

(56) References Cited

U.S. PATENT DOCUMENTS 4,984,215 A * 1/1991 Ushida .................. 365/230.06

FOREIGN PATENT DOCUMENTS

JP 11-288587 * 10/1999

* cited by examiner

*Primary Examiner*—A. Zarabian
(74) *Attorney, Agent, or Firm*—Hutchins, Wheeler & Dittmar

(57) ABSTRACT

A semiconductor memory device is provided which is capable of initializing the data values stored in memory cells in a shorter time without increasing the size of a chip. The semiconductor memory device comprises memory cells arranged at the intersection of word lines and data lines; a level setting circuit which sets the levels of the data lines to a predetermined initialization level when an initialization signal, which is activated when the data values stored in the memory cells are initialized, is activated; a delay circuit which delays the initialization signal to generate delayed initialization signals, each of which corresponds to one of the word lines and the delay times thereof differ from each other; and a logic circuit which sets the level of one of the word lines corresponding to one of the delayed initialization signals to an activation level when the corresponding delayed initialization signal is activated.

7 Claims, 4 Drawing Sheets

SEMICONDUCTOR MEMORY DEVICE

BACKGROUND OF THE INVENTION

1. Field of the Invention

The present invention relates to a semiconductor memory device such as a random access memory (hereinbelow referred to as a RAM), and in particular, to a technique for initializing the data values stored in a RAM.

2. Description of the Related Art

The data values held in cache memories and in RAMs that are widely used are generally undefined when the supply of power is started. Therefore, it is often necessary to initialize every data value held in a RAM (e.g., to set the data value stored in every memory cell to "0") during the period starting immediately after a start of the supply of power and ending when the use of the RAM begins.

There are two ways of carrying out the initialization of the data values stored in a RAM, namely, a technique by means of software and a technique by means of hardware.

According to the general software technique, after the supply of power has been started and a computer has started its operation, an initialization program is started to initialize the data values stored in the RAM by writing "0" into every memory cell (every address). In general, at least one clock cycle is required for initializing the data value stored in a single memory cell, so that at least a time, measured in clock cycles, equal to the number of memory cells is required for initializing the data values stored in every memory cell.

On the other hand, a first example of the hardware technique is disclosed in Japanese Unexamined Patent Application, First Publication No. Hei 11-134865. According to this technique, as shown in FIG. 3, in addition to the same structure of a normal SRAM (Static RAM) comprising two inverters 108 and 109 and two switching transistors 110 and 111, an initialization transistor 202, to which a reset signal is supplied, is provided in each memory cell 201A, 201B, . . . , 201H. An initialization signal RESET is commonly supplied to the gate electrode of every initialization transistor 202. When the initialization signal RESET is set to an activation level upon the start of the supply of power, all of the initialization transistors 202 provided in the 10 memory cells 201A to 202H conduct so as to set the input of the inverter 109 to "0", whereby the data value held in a latch circuit comprised by the inverters 108 and 109 is initialized. As described above, according to the first example, the data values held in all the memory cells are simultaneously initialized.

A second example of the hardware technique is disclosed in Japanese Unexamined Patent Application, First Publication No. Sho 61-214198. According to this technique, a counter/decoder 115, which comprises a counter and a decoder controlled by the output from the counter, is provided as shown in FIG. 4. When the data values stored in a RAM are initialized, the value of the counter is incremented to sequentially activate one of a plurality of word lines, and "0"s are simultaneously written into a plurality of memory cells that are connected to an activated word line.

However, according to the software initialization technique described above, a time, measured in clock cycles, equal to the number of memory cells is required for initializing the data values stored in the RAM. It is therefore difficult to initialize all of the data values stored in the memory cells in a shorter time.

On the one hand, the hardware technique according to the first example requires seven transistors for individual memory cells 201A to 201H as shown in FIG. 3. More specifically, since each inverter 108 and 109 comprises two transistors, seven transistors are required for forming a memory cell, which comprises the switching transistors 110 and 111, the initialization transistor 202, and the two inverters. Furthermore, according to the first example, wires for supplying the initialization signal RESET to the initialization transistor 202 provided in the individual memory cells should be provided within the area of the individual memory cells. In view of the above, with the first example, the area required for constructing the memory cells increases, resulting in a problem in that the area of the chip increases.

On the other hand, the second example requires a clock (not shown in the figures) for working the counter provided in the counter/decoder 115. In addition, the size of the circuit for constructing the counter/decoder 115 is considerably large. Therefore, a problem arises in that the chip area increases as does in the first example.

SUMMARY OF THE INVENTION

It is therefore an object of the present invention to provide a semiconductor memory device that is capable of initializing the data values stored in the memory cells in a shorter time without increasing the size of a chip.

A semiconductor memory device of the present invention is provided with a plurality of word lines; a plurality of data lines; a plurality of memory cells which are arranged at the intersection of the word lines and the data lines; a level setting circuit which sets the levels of the data lines to a predetermined initialization level when an initialization signal, which is activated when the data values stored in the memory cells are initialized, is activated; a delay circuit which delays the initialization signal to generate a plurality of delayed initialization signals, each of which corresponds to one of the word lines, and the delay times thereof differ from each other; and a logic circuit which sets the level of one of the word lines corresponding to one of the delayed initialization signals to an activation level when the corresponding delayed initialization signal is activated.

In this way, the present invention comprises the delay circuit for successively delaying the initialization signal, and the memory cells connected to an activated word line are set to a predetermined initialization level, while successively activating the word lines with the delayed initialization signals supplied from the delay circuit. Therefore, it is possible to initialize all of the memory cells asynchronously with a clock in a shorter time in comparison with the software initialization technique. Further, in the present invention, since a plurality of word lines are not simultaneously activated, it is not necessary to simultaneously carry out the writing of data into a plurality of memory cells connected to the same data line. Therefore, the driving power for carrying out the writing of data into a single memory cell is sufficient for the driving power of elements constituting the level setting circuit such as transistors, and thus the area can be reduced.

Unlike the conventional hardware technique according to the first example, it is not necessary for the present invention to provide initialization transistors as well as wires for supplying initialization signals thereto in the area of the memory cells, and hence the area can be reduced in comparison with the first example.

In addition, unlike the conventional hardware technique according to the second example, the present invention does not require complicated circuits such as a counter. The present invention can be comprised, for example, of a delay circuit comprising inverters connected in series, and a logic circuit comprising OR gates and the like. It is therefore not necessary for the present invention to provide complicated circuits such as a counter as well as a clock signal for operating the counter, thereby enabling a simple circuit structure.

DETAILED DESCRIPTION OF THE PREFERRED EMBODIMENTS

Hereinbelow, an embodiment of the present invention will be described with reference to the drawings. In the present embodiment, a description will be given for an SRAM shown in FIG. 1 as an example.

Figure 1:
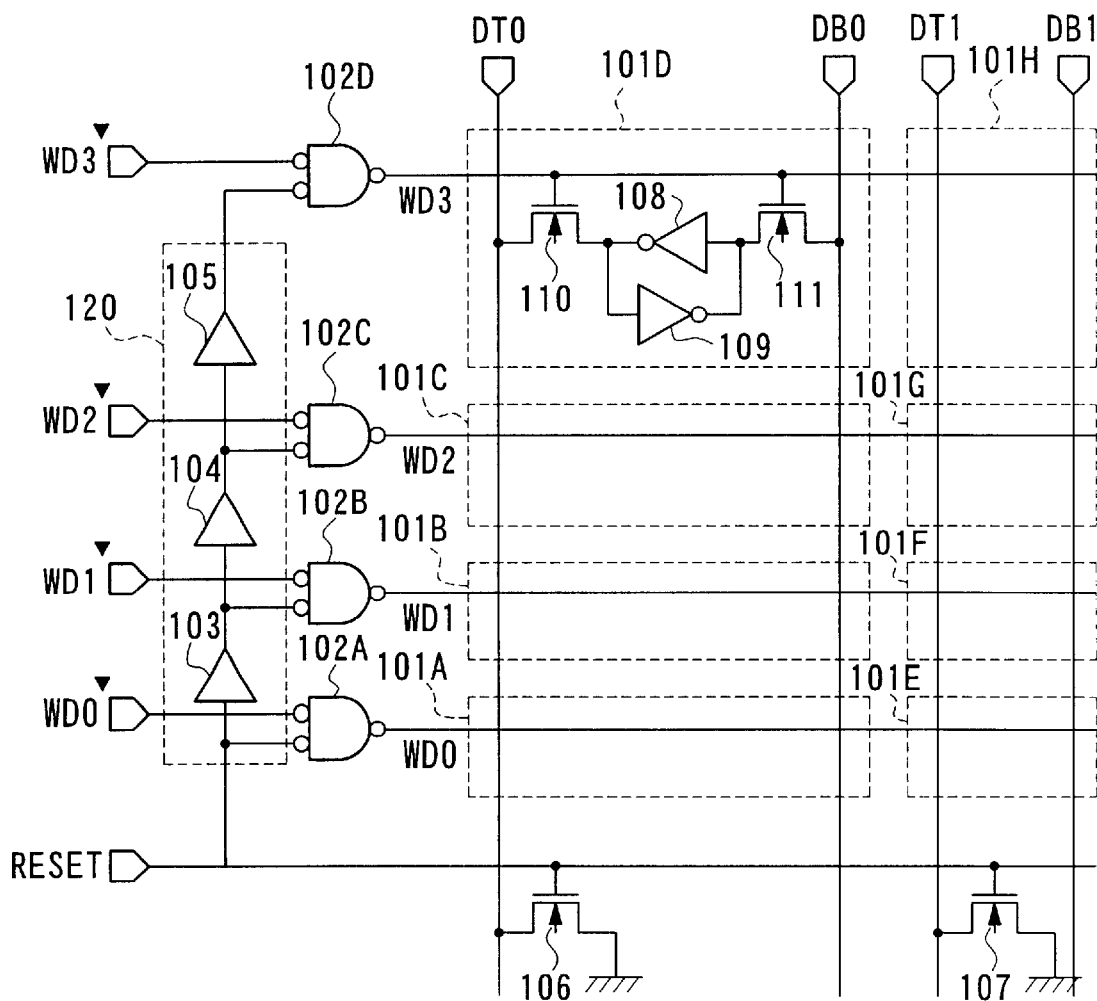
FIG. 1 is a circuit diagram showing the principal structure of a semiconductor memory device according to an embodiment of the present invention.

As shown in FIG. 1, memory cells 101A, 101B, ..., 101H are arranged in the same manner as an array. Each memory cell is connected to one of word lines WD0 to WDn, and is also connected to either a pair of complementary data lines (also referred to as bit lines) DT0 and DB0 or a pair of complementary data lines DT1 and DB1. All the memory cells are identical in structure, so that, in FIG. 1, the detailed structure for the memory cell 101D is shown as a representative structure.

Figure 3:
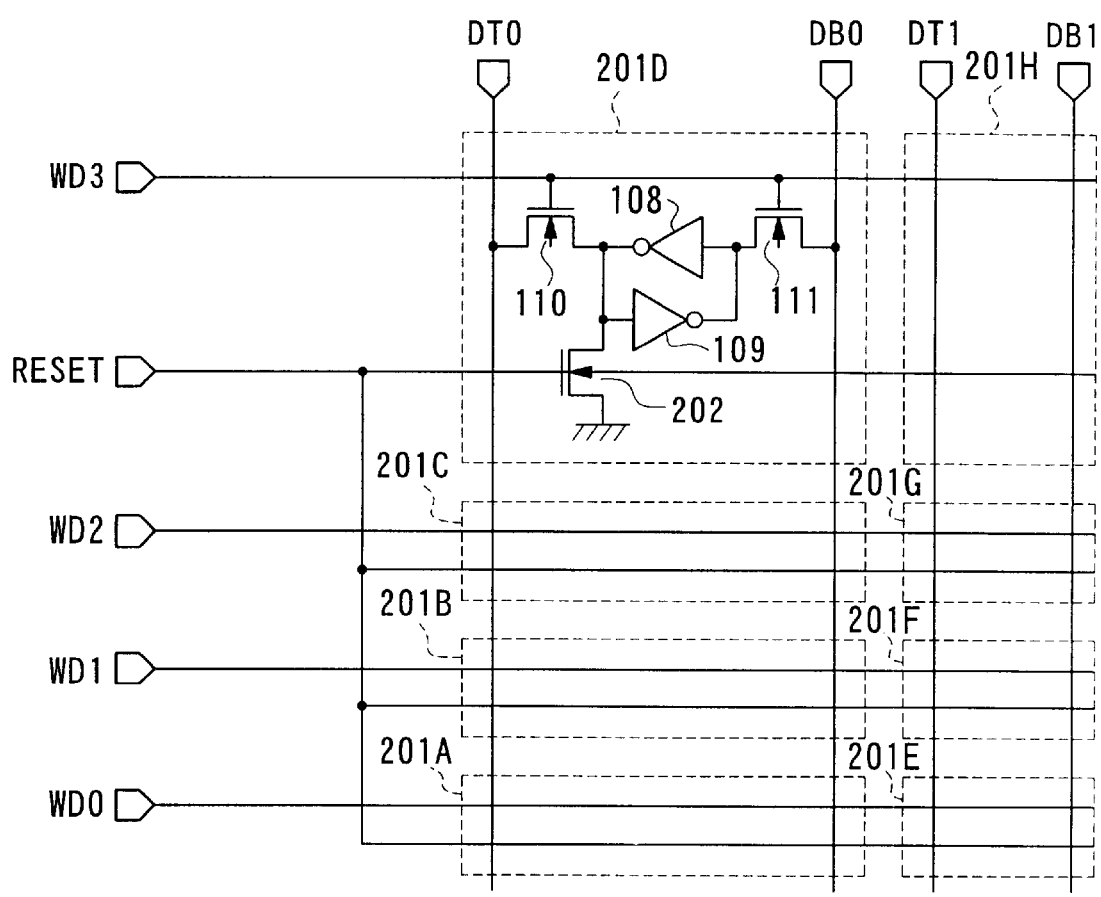
FIG. 3 is a circuit diagram showing the principal structure of a conventional semiconductor device according to a first example by means of hardware.
Figure 4:
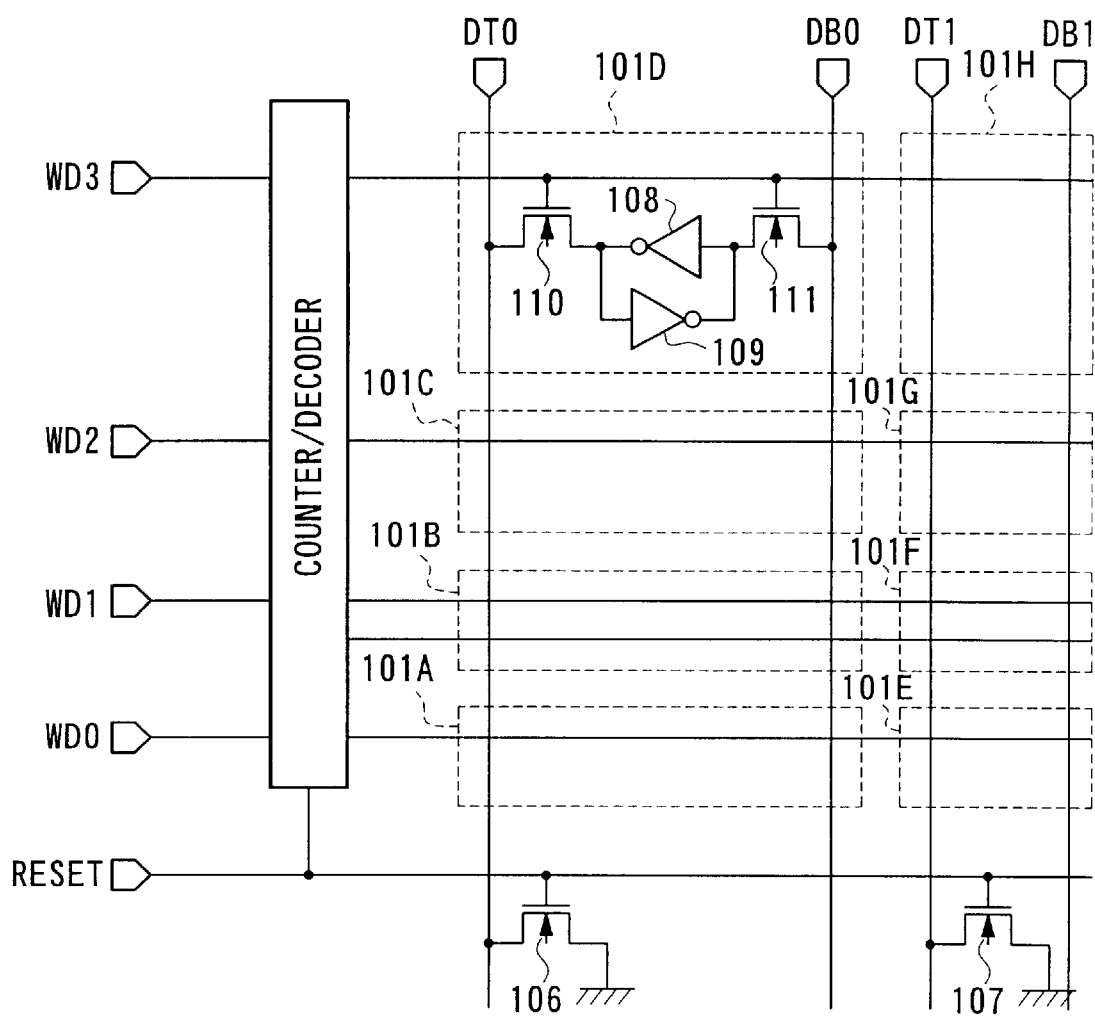
FIG. 4 is a circuit diagram showing the principal structure of a conventional semiconductor device according to a second example by means of hardware.

Each memory cell is provided with two inverters 108 and 109, and two switching transistors 110 and 111, and thus each memory cell does not include extra constituents such as the initialization transistor 202 shown in FIG. 3.

Initialization transistors 106 and 107 are inserted between the ground and the data lines DT0 and DT1, respectively. An initialization signal RESET, whose level becomes an activation level as a result of the detection of the supply of power, is supplied to the gate electrodes of the initialization transistors 106 and 107. When the initialization signal RESET is set to "1", the voltages of all the data lines DT0, DT1, and the like are set to 0 V. Further, a driving power comparable to that of transistors constituting write buffers (not shown in the figures) is sufficient to drive the initialization transistors 106 and 107.

One end of each of word lines WD0 WD1, ..., WD3 are connected to the outputs from OR gates 102A, 102B, ..., 102D, respectively. The outputs from a decoder (not shown in the figures), namely, word lines (or word line selection signals) WD0', WD1', ..., WD3' used in general RAMs, are supplied to the OR gates as first inputs thereof, respectively.

The initialization signal RESET is also supplied to a delay circuit 120 comprising delay elements 103, 104, and 105 connected in series. The outputs from the delay elements 103, 104, and 105 are supplied to the OR gates 102B, 102C, and 102D, respectively, as second inputs thereof. The initialization signal RESET is directly supplied to a second input of the OR gate 102A.

Owing to the operation of the delay circuit 120, the outputs from the OR gates (that is to say, the word lines WD0, WD1, ..., WD3) do not simultaneously change to an activated level ("1") even when the initialization signal RESET is activated, and, instead, the outputs are successively changed to the activated level in accordance with the delay times of the delay elements 103 to 105.

The delay time of each delay element 103 to 105 should be set to at least the time required for completing the writing of data into the memory cells, and thus the delay time is set to approximately 3 ns in this embodiment. The delay elements 103 to 105 can be comprised, for example, of a plurality of inverter circuits (more accurately, an even number of inverter circuits) connected in series.

In this embodiment, although a description will be given for the structure using the OR gates 102A to 102D, the present invention is not limited to such a structure. As long as the voltage of each word line is set to an activation level when signals obtained by delaying the initialization signal RESET by means of the delay circuit 120 are activated, any logic gates or any logic circuits can be used. That is to say, they are not limited to OR gates, and may be a circuit using NAND gates and the like.

Subsequently, the operation of an SRAM according to the present embodiment will be explained. Here, in FIG. 1, the situation in which the inverter 108 provided in each memory cell (e.g., the memory cell 101A) outputs "1" means that the memory cell 101A holds "1", and, in other words, it means that "1" is written into the memory cell 101A.

Figure 2:
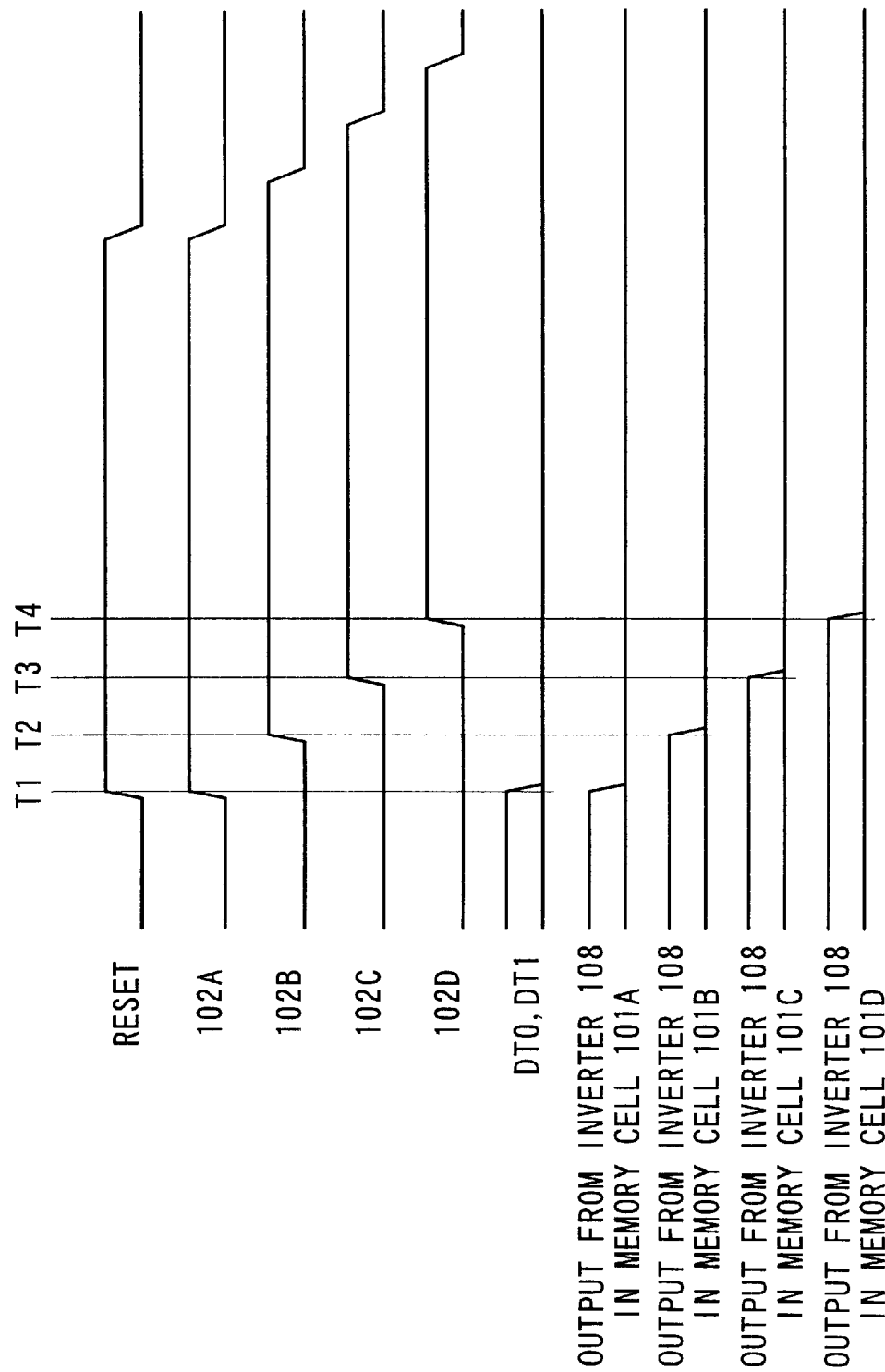
FIG. 2 is a timing chart showing an operation of the semiconductor memory device according to the embodiment.

Hereinbelow, the operation of the SRAM at the time of initialization will be explained with reference to the timing chart shown in FIG. 2. First, the initialization signal RESET is set to "1" at time T1 in FIG. 2 when the supply of power is detected, so that the initialization transistors 106 and 107 conducts so as to set the data lines DT0 and DT1 to "0", respectively. At the same time, the word line WD0 connected to the output from the OR gate 102A is set to an activation level, so that "0"s are written into the memory cells 101A and 101E connected to the word line WD0.

Next, the output of the OR gate 102B is set to the activated level at time T2 (i.e., a time corresponding to the delay time of the delay element 103 has elapsed after time T1). For this reason, the word line WD1 is activated and "0"s are written into the memory cells 101B and 101F.

In the same manner described above, "0" s are successively written into memory cells 101C and 101D at times T3 and T4, respectively, whereby the data values held therein are initialized. The initialization processes are carried out in the same manner described above for the memory cells 101G and 101H.

In this way, in the present embodiment, a plurality of word lines are not simultaneously activated, but they are successively activated instead. The time interval between the activation of a word line and the activation of another word line is determined by the delay times of the delay elements 103 to 105. As described above, each delay time is set to at least the time necessary to complete the writing of data into the memory cells. In other words, in the present embodiment, write operations for a plurality of memory cells connected to the same data line are not simultaneously performed. For this reason, the driving power capable of writing data into a single memory cell is sufficient for the driving power of the initialization transistors 106 and 107 which drive the data lines DT0 and DT1, respectively, Although it is assumed that the semiconductor memory device is an SRAM in the present embodiment described above, the present invention is not limited to such a case. Even if the semiconductor memory device is another type of RAM, the effects obtained in the present embodiment can be similarly obtained.

Further, in the above description, the initialization signal RESET is directly supplied to the OR gate 102A. However, the semiconductor memory device may be constructed in such a way that a delay element whose structure is similar to that of the delay elements 103 to 105 is included in the delay circuit 120, the initialization signal RESET is supplied thereto, and the output thereof is supplied to the input of the delay element 103 as well as the second input of the OR gate 102A. By doing so, it is possible to make each delay element constituting the delay circuit 120 correspond to each OR gate.

As explained above in detail, in the present invention, delay elements that delay the initialization signal RESET one after another are provided in order to realize the operation for successively activating the word lines. In general, according to a conventional software technique for initializing, at least a time corresponding to n clock cycles is required for initializing the data values stored in a RAM having n memory cells. Additionally, at least a time corresponding to n clock cycles is required for initializing the data values stored in a cache memory comprising n number of entries (here, an entry is defined in such a way that the number of entries multiplied by the size of a line of a cache memory is equal to the number of memory cells). Conversely, according to the present embodiment, the data values stored in the memory cells can be initialized within a period corresponding to one to three clock cycles, which depends on the number of word lines provided in the RAM. As the number of memory cells is increased, the effect of shortening the time required for initialization becomes more remarkable. For this reason, it is possible for the present embodiment to initialize the data values stored in all of the memory cells asynchronously with a clock in a short period of time, in comparison with the conventional software technique for initializing the data values stored in a RAM.

Moreover, according to the first example of the hardware technique in which an initialization transistor is provided in each memory cell, each memory cell is constructed with seven transistors, so that the same number of initialization transistors as there are memory cells must be provided. Conversely, each memory cell of the present embodiment is provided with six transistors, so that a reduction in the area of approximately 14% can be achieved in comparison with the first example.

Further, unlike the second example of the hardware technique, in the present embodiment, an extra circuit such as the counter provided in the counter/decoder 115 in addition to a clock is not required. For this reason, the present embodiment makes it possible to simplify the structure of circuits in comparison with the second example which employs the counter.

What is claimed is:

1. A semiconductor memory device comprising:
   a plurality of word lines;
   a plurality of data lines;
   a plurality of memory cells which are arranged at the intersection of said word lines and said data lines;
   a level setting circuit which sets the levels of said data lines to a predetermined initialization level when an initialization signal, which is activated when the data values stored in said memory cells are initialized, is activated;
   a delay circuit which delays said initialization signal to generate a plurality of delayed initialization signals, each of which corresponds to one of said word lines, and delay times thereof differ from each other; and
   a logic circuit which sets the level of one of said word lines corresponding to one of said delayed initialization signals to an activation level when the corresponding delayed initialization signal is activated.

2. A semiconductor memory device according to claim 1, wherein said delay circuit is provided with a plurality of delay elements connected in series, and the outputs of said delay elements are extracted as said delayed initialization signals.

3. A semiconductor memory device according to claim 2, wherein the delay times of each delay element are set so as to be longer than the time necessary for carrying out the writing of data into said memory cells.

4. A semiconductor memory device according to claim 2, wherein each of said delay elements is provided with a plurality of inverters connected in series.

5. A semiconductor memory device according to claim 1, wherein the structure of said memory cells is identical to that of memory cells provided in a static random access memory.

6. A semiconductor memory device according to claim 1, wherein when either one of word line selection signals for activating said word lines or one of said delayed initialization signals is activated, said logic circuit sets the word line corresponding to the activated signal to an activation level.

7. A semiconductor memory device according to claim 1, wherein the driving power of said level setting circuit is set to the comparable driving power necessary to carry out the writing of data into a single memory cell.

* * * * *